United States Patent
Chen et al.

(10) Patent No.: US 10,727,742 B2
(45) Date of Patent: Jul. 28, 2020

(54) POWER CONVERTER WITH IMPROVED LOAD TRANSIENT RESPONSE AND ASSOCIATED CONTROL METHOD

(71) Applicant: Chengdu Monolithic Power Systems Co., Ltd., Chengdu (CN)

(72) Inventors: Changjiang Chen, Chengdu (CN); Lei Li, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 24 days.

(21) Appl. No.: 16/162,042

(22) Filed: Oct. 16, 2018

(65) Prior Publication Data
US 2019/0115831 A1    Apr. 18, 2019

(30) Foreign Application Priority Data

Oct. 16, 2017    (CN) .......................... 2017 1 0957260

(51) Int. Cl.
| | | |
|---|---|---|
| H02M 1/00 | (2006.01) | |
| H02M 3/156 | (2006.01) | |
| H02M 3/158 | (2006.01) | |
| G05F 1/10 | (2006.01) | |
| H02M 11/00 | (2006.01) | |
| H03K 19/20 | (2006.01) | |

(52) U.S. Cl.
CPC .............. *H02M 3/156* (2013.01); *G05F 1/10* (2013.01); *H02M 3/158* (2013.01); *H02M 11/00* (2013.01); *H03K 19/20* (2013.01); *H02M 3/1588* (2013.01); *H02M 2003/1566* (2013.01)

(58) Field of Classification Search
CPC . H02M 2001/0016; H02M 2001/0048; H02M 2001/0054; H02M 1/14; H02M 1/143; H02M 1/32; H02M 3/156; H02M 3/158; H02M 3/1588; H02M 2003/1566; G05F 1/10; G05F 1/46; G05F 1/462; G05F 1/467
See application file for complete search history.

(56) References Cited

U.S. PATENT DOCUMENTS

| | | | | |
|---|---|---|---|---|
| 7,598,715 | B1 * | 10/2009 | Hariman ............. | H02M 3/1588 323/222 |
| 2005/0057228 | A1 * | 3/2005 | Shih ........................ | H02M 1/38 323/222 |
| 2005/0128776 | A1 * | 6/2005 | Dequina ............... | H02M 1/088 363/89 |
| 2005/0258808 | A1 * | 11/2005 | Chen .................... | H02H 7/1213 323/222 |
| 2006/0113980 | A1 * | 6/2006 | Yoshida ............. | H02M 3/1588 323/282 |
| 2008/0136383 | A1 * | 6/2008 | Hasegawa ........... | H02M 3/1588 323/271 |

(Continued)

*Primary Examiner* — Nguyen Tran
*Assistant Examiner* — David A. Singh
(74) *Attorney, Agent, or Firm* — Perkins Coie LLP (57) ABSTRACT

A power converter including a load transient enhancing module and associated method for improving load transient response of the power converter. The load transient enhancing module detects whether load transient is occurring in a load of the power converter, and turns the secondary switch off and locks the secondary switch at "OFF" state to turn on a body diode of the secondary switch once load transient is occurring in the load.

9 Claims, 4 Drawing Sheets

(56) References Cited

U.S. PATENT DOCUMENTS

| | | | | |
|---|---|---|---|---|
| 2008/0298106 | A1* | 12/2008 | Tateishi | H02M 3/1588 363/127 |
| 2008/0315853 | A1* | 12/2008 | Capilla | H02M 3/1588 323/288 |
| 2011/0273155 | A1* | 11/2011 | Weir | H02M 3/156 323/283 |
| 2012/0105146 | A1* | 5/2012 | Shono | H02M 3/1588 327/581 |
| 2013/0241516 | A1* | 9/2013 | Ueno | G05F 1/618 323/285 |
| 2013/0342181 | A1* | 12/2013 | Suppanz | H02M 3/156 323/271 |
| 2014/0159691 | A1* | 6/2014 | Miyamae | H02M 3/1588 323/283 |
| 2014/0191736 | A1* | 7/2014 | Babazadeh | H02M 3/1582 323/271 |
| 2016/0006340 | A1* | 1/2016 | Xu | H02M 3/156 323/271 |
| 2017/0063227 | A1* | 3/2017 | Nakamura | H02M 3/158 |
| 2018/0026538 | A1* | 1/2018 | Dalena | H02M 3/158 323/271 |

* cited by examiner

POWER CONVERTER WITH IMPROVED LOAD TRANSIENT RESPONSE AND ASSOCIATED CONTROL METHOD

CROSS-REFERENCE TO RELATED APPLICATION(S)

This application claims the benefit of CN application No. 201710957260.1 filed on Oct. 16, 2017 and incorporated herein by reference.

TECHNICAL FIELD

This disclosure relates generally to power converters, and more particularly but not exclusively relates to load transient response control of switching power converters.

BACKGROUND

Switching power converters are widely used in various electronic devices as power supplies for providing appropriate supply voltage or supply current to the electronic devices.

Most switching power converters are employed to convert an input voltage into an appropriate output voltage through controlling a switch module to switch on and off, thereby regulating power transmitted to a load.

However, when the load changes rapidly, the output voltage may widely vary. For instance, the output voltage may drop largely if the load gets lighter and requires a smaller current. In this circumstance, it is desired that the load transient response performance (i.e. the transient response capability of the output voltage to the change in the current required by the load) of the switching power converters can be improved. In other words, it is desired that the output voltage can be regulated to restore to its desired value as quickly as possible.

SUMMARY

In accomplishing the above and other objects, there has been provided, in accordance with an embodiment of the present invention, a load transient enhancing module for a power converter. The power converter may have a main switch and a secondary switch. The load transient enhancing module may comprise: a first input terminal, configured to receive a secondary switch control signal, wherein the secondary switch control signal is used to control on and off switching of the secondary switch; a second input terminal, configured to receive a load transient indication signal, wherein the load transient indication signal indicates whether transient change is occurring in a load of the power converter; and an output terminal, configured to provide a load transient enhancing signal.

The load transient enhancing module may be configured to generate the load transient enhancing signal at least based on the secondary switch control signal and the load transient indication signal; wherein when the load transient indication signal indicates that transient change is occurring, the load transient enhancing module is configured to disable/shield the secondary switch control signal, and to set the load transient enhancing signal to turn off the secondary switch and lock the secondary switch at "OFF" state so that a body diode of the secondary switch is turned on. When the load transient indication signal indicates that no transient change is occurring, the load transient enhancing module is further configured to enable/unshield the secondary switch control signal, and to synchronize the load transient enhancing signal with the secondary switch control signal to control the secondary switch to perform normal on and off switching.

The load transient enhancing module may further comprise a third input terminal configured to receive a main switch control signal, wherein the main switch control signal is used to control on and off switching of the main switch. When the load transient indication signal indicates that no transient change is occurring as well as the main switch control signal changes to a logic state that drives the main switch on, the load transient enhancing module is configured to enable/unshield the secondary switch control signal, and to synchronize the load transient enhancing signal with the secondary switch control signal.

The load transient enhancing module may further comprise a schottky diode connected in parallel with the secondary switch. When the load transient indication signal indicates that transient change is occurring, the load transient enhancing module is configured to turn off the secondary switch and lock the secondary switch at "OFF" state, and to turn on the schottky diode instead of the body diode. When the load transient indication signal indicates that no transient change is occurring, the load transient enhancing module is further configured to turn off the schottky diode, and to synchronize the load transient enhancing signal with the secondary switch control signal to control the secondary switch to perform normal on and off switching.

There has also been provided, in accordance with an embodiment of the present invention, a power converter. The power converter may comprise: an input port, configured to receive an input voltage; an output port configured to supply a load; a main switch and a secondary switch coupled in series between the input port and a reference ground; and a load transient enhancing module, configured to turn off the secondary switch and lock the secondary switch at "OFF" state to turn on a body diode of the secondary switch once the load has transient change. The load transient enhancing module may further be configured to unlock the secondary switch from the "OFF" state to allow the secondary switch to perform normal on and off switching when no transient change is occurring in the load or when transient change in the load has been removed.

There has also been provided, in accordance with an embodiment of the present invention, a method for improving load transient response of a power converter having a main switch and a secondary switch. The method may comprise: detecting whether transient change is occurring in a load of the power converter; and when transient change occurs in the load of the power converter, turning off the secondary switch and locking the secondary switch at "OFF" state so that a body diode of the secondary switch turns on. The method may further comprise: when no transient change is occurring in the load of the power converter or transient change has been removed, unlocking the secondary switch from the "OFF" state to allow the secondary switch to perform normal on and off switching.

The method may further comprise: providing a schottky diode connected in parallel with the secondary switch; and when transient change is occurring in the load of the power converter, turning off the secondary switch and locking the secondary switch at "OFF" state and turning on the schottky diode. When no transient change is occurring in the load of the power converter or transient change has been removed, unlocking the secondary switch from the "OFF" state and turning off the schottky diode.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

DETAILED DESCRIPTION

Various embodiments of the present invention will now be described. In the following description, some specific details, such as example circuits and example values for these circuit components, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. Those skilled in the art should understand that the meanings of the terms identified above do not necessarily limit the terms, but merely provide illustrative examples for the terms.

Figure 1:
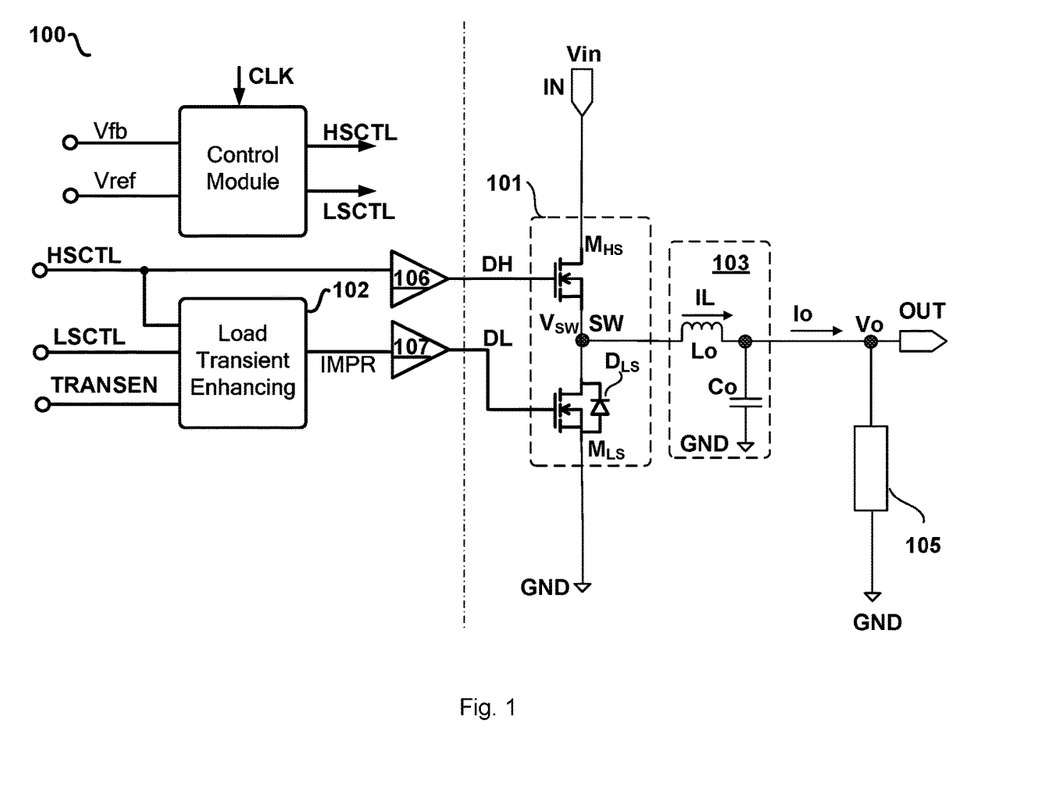
FIG. 1 illustrates a block diagram of a power converter 100 in accordance with an embodiment of the present invention.

FIG. 1 illustrates a block diagram of a power converter 100 in accordance with an embodiment of the present invention. The power converter 100 may comprise: an input port IN configured to receive an input voltage Vin; an output port OUT configured to provide an output voltage Vo and an output current Io for supplying a load 105; a switch module 101; and a control module. The switch module 101 may at least comprise a main switch (e.g. the main switch MHS illustrated in FIG. 1). The switch module 101 may have a first terminal coupled to the input port IN, a second terminal coupled to the output port OUT and a control terminal configured to receive a driving signal (e.g. at least comprising the high side driving signal DH illustrated in FIG. 1). The switch module 101 is configured to conduct on and off switching based on the driving signal to convert the input voltage Vin into the output voltage Vo. The control module may be configured to provide the driving signal (e.g. at least comprising the high side driving signal DH illustrated in FIG. 1) at least based on a feedback signal Vfb indicative of the output voltage Vo and a reference signal Vref indicative of a desired value of the output voltage Vo. A clock signal CLK may be provided to the control module to set a switching frequency.

In accordance with the exemplary embodiment of FIG. 1, the switch module 101 of the power converter 100 may further comprise a secondary switch MLS. The main switch MHS and the secondary switch MLS are coupled in series between the input port IN and a reference ground GND, and the common connection of the main switch MHS and the secondary switch MLS forms a switching node SW which can be considered as the second terminal of the switch module 101. The main switch MHS may comprise a controllable switching device, e.g. illustrated as a MOSFET in FIG. 1. The secondary switch MLS may also comprise a controllable switching device, e.g. illustrated as a MOSFET in FIG. 1. In the embodiment where the secondary switch MLS comprises the controllable switching device, the control module may further provide a low side driving signal DL to the switch module 101 to drive the secondary switch MLS, wherein the low side driving signal DL is an logic complementary signal to the high side driving signal DH. With the control of the control module, the main switch MHS and the secondary switch MLS are driven to switch on and off complementarily, i.e. when the main switch MHS is switched on, the secondary switch MLS is switched off, and vice versa. The switch module 101 provides a switching signal VSW at the switching node SW.

In accordance with an embodiment of the present invention, the power converter 100 may further comprise a filtering module 103. The filtering module 103 is coupled to the input port IN when the main switch MHS is on to store energy, and is coupled to the output port OUT when the main switch MHS is off to deliver energy to the load 105. In the example of FIG. 1, the filtering module 103 is illustrated to comprise an inductive power storage device Lo and a capacitive power storage device Co. The inductive power storage device Lo is at least coupled to the switch module 101. For instance, in the embodiment of FIG. 1, a first terminal of the inductive power storage device Lo is coupled to the switching node SW of the switch module 101, a second terminal of the inductive power storage device Lo is coupled to the output port OUT. When the main switch MHS is on, the inductive power storage device Lo is connected to the input port IN to store energy. When the main switch MHS is off, the inductive power storage device Lo is disconnected from the input port IN, and is connected to the output port OUT to discharge energy. An inductor current IL is generated and flows through the inductive power storage device Lo during the storage and discharge of energy. The capacitive power storage device Co has a first terminal coupled to the output port OUT and a second terminal connected to the reference ground GND and is configured to filter the output signal (e.g. the switching signal VSW) of the switch module 101 to provide the smoothed output voltage Vo.

In accordance with an embodiment of the present invention, the control module may be configured to utilize peak current control pulse width modulation mode or constant on time control mode or other appropriate control mode to control the on and off switching of the switch module 101. In an embodiment, the control module is configured to at least provide a high side driving signal DH to the main switch MHS of the switch module 101 to control the on and off switching of the main switch MHS. The switch module 101 may be considered as on when the main switch MHS is on, and considered as off when the main switch MHS is off. A fraction of time that the main switch MHS is switched on during the total time of an on and off switching cycle may be referred to as an on duty cycle of the switch module 101 or the power converter 100. The control module regulates the output voltage Vo through regulating the on duty cycle. When the load 105 changes rapidly, for instance, when the load 105 suddenly gets lighter or drops sharply (i.e. the output current Io required by the load 105 decreases sharply), the control module generally controls the main switch MHS to switch off and controls the secondary switch MLS to switch on so as to discharge the energy stored in the inductive power storage device Lo to the capacitive power storage device Co. However, this would result in large overshoot in the output voltage Vo. The overshoot gets more severe if the output voltage Vo is lower.

In accordance with an embodiment of the present invention, the power converter 100 may comprise a load transient enhancing module 102. Once the load 105 is transient changing (e.g. once the load 105 is getting lighter instantly), the load transient enhancing module 102 may be configured to turn off the secondary switch MLS and lock the secondary switch MLS at "OFF" state, so that a body diode DLS of the secondary switch MLS turns on to pull the switching signal VSW from 0V to −VD, wherein VD is a forward conduction voltage of the body diode DLS (e.g. normally VD=0.8V). In this fashion, once the load 105 is getting lighter instantly, the inductor current IL flowing through the inductive power storage device Lo may be decreased with a larger slope, making the energy transferred/discharged from the inductive power storage device Lo to the capacitive power storage device Co effectively reduced so that overshoot in the output voltage Vo is reduced.

Figure 2:
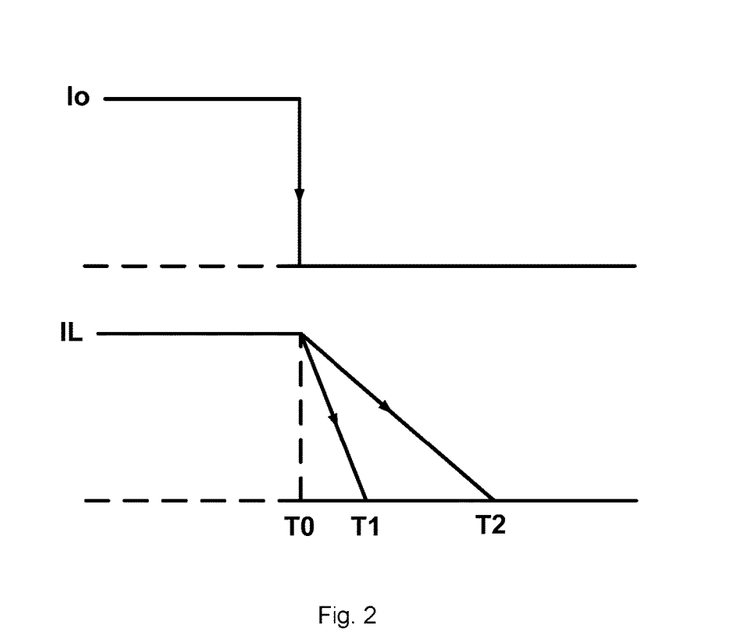
FIG. 2 illustrates a waveform diagram showing the inductor current IL change comparison between the body diode DLS blocked and the body diode DLS conducted when the output current Io of the power converter 100 decreases sharply.

FIG. 2 illustrates a waveform diagram showing the inductor current IL change comparison between the body diode DLS blocked and the body diode DLS conducted when the output current Io decreases sharply (i.e. the load 105 gets lighter instantly). At time T0, the load 105 suddenly gets lighter, the inductor current IL starts to decrease. If the body diode DLS of the secondary switch MLS is conducted as taught in the present disclosure, the inductor current IL can be discharged to a steady state value at time T1. Otherwise, if the body diode DLS of the secondary switch MLS is blocked as in conventional applications, the inductor current IL cannot be discharged to the steady state value until time T2, wherein T2>T1>0. A reduction ratio K of the overshoot in the output voltage Vo reduced in accordance with various embodiments of the present invention in comparison with conventional applications may be expressed by the following expression (1):

$$K=1-Vo/(Vo+VD) \quad (1)$$

From the above expression (1), it can be seen that the load transient enhancing module 102 in accordance with various embodiments of the present invention may help to reduce the overshoot in the output voltage Vo resulted from the load 105 transient change, and the reduction ratio K increases with the output voltage Vo decreases. That is to say, the load transient enhancing module 102 in accordance with various embodiments of the present invention has stronger overshoot suppression effect if the output voltage Vo is lower. To provide an example, suppose Vo=1.2V, VD=0.8V, compared with conventional power converters, the load transient enhancing module 102 can make the overshoot in the output voltage Vo of the power converter 100 be reduced as high as K=1−1.2/(1.2−0.8)=40% in accordance with various embodiments of the present invention.

In accordance with an embodiment of the present invention, when no transient change is occurring in the load 105 or when load 105 transient change has been removed (or the overshoot in the output voltage Vo is removed), the load transient enhancing module 102 may further be configured to unlock the secondary switch MLS from the "OFF" state to allow the secondary switch MLS to perform normal on and off switching.

In accordance with an embodiment of the present invention, as shown in the example of FIG. 1, the load transient enhancing module 102 may have a first input terminal, a second input terminal and an output terminal. The load transient enhancing module 102 may be configured to receive a secondary switch control signal LSCTL and a load transient indication signal TRANSEN respectively at the first input terminal and the second input terminal, and to provide a load transient enhancing signal IMPR at the output terminal at least based on the secondary switch control signal LSCTL and the load transient indication signal TRANSEN. The secondary switch control signal LSCTL is used to control the on and off switching of the secondary switch MLS. The load transient indication signal TRANSEN indicates whether transient change (e.g. change from heavy load to light load/no load) is occurring in the load 105, and may have an active state (e.g. logic high state) indicative of transient change occurrence and an inactive state (e.g. logic low state) indicative of transient change nonoccurrence. When the load transient indication signal TRANSEN indicates that transient change is occurring (i.e. has the active state), the load transient enhancing module 102 may be configured to disable/shield the secondary switch control signal LSCTL, and to set the load transient enhancing signal IMPR to turn off the secondary switch MLS and lock the secondary switch MLS at "OFF" state. When the load transient indication signal TRANSEN indicates that no transient change is occurring (i.e. has the inactive state), the load transient enhancing module 102 may be configured to enable/unshield the secondary switch control signal LSCTL, and to synchronize the load transient enhancing signal IMPR with the secondary switch control signal LSCTL so as to control the secondary switch MLS to perform normal on and off switching. In an embodiment, when the load transient indication signal TRANSEN indicates that no transient change is occurring, the secondary switch control signal LSCTL may be output as the load transient enhancing signal IMPR and be transferred to a low side driver 107 to generate the low side driving signal DL to drive the secondary switch MLS.

In accordance with an embodiment of the present invention, the load transient enhancing module 102 may further have a third input terminal. The load transient enhancing module 102 may be configured to receive a main switch control signal HSCTL. The main switch control signal HSCTL is used to control the on and off switching of the main switch MHS. In an embodiment, the main switch control signal HSCTL may be transferred to a high side driver 106 to generate the high side driving signal DH to drive the main switch MHS. The main switch control signal HSCTL and the secondary switch control signal LSCTL are logically complementary, i.e. when the main switch control signal HSCTL is at logic high state, the secondary switch control signal LSCTL is at logic low state, when the main switch control signal HSCTL is at logic low state, the secondary switch control signal LSCTL is at logic high state. In this exemplary embodiment, when the load transient indication signal TRANSEN indicates that no transient change is occurring (i.e. has the inactive state) as well as the main switch control signal HSCTL changes to a logic state (e.g. logic high state) that drives the main switch MHS on, the load transient enhancing module 102 is configured to enable/unshield the secondary switch control signal LSCTL, and to synchronize the load transient enhancing signal IMPR with the secondary switch control signal LSCTL so as to control the secondary switch MLS to perform normal on and off switching. In this manner, the logic control to the power converter 100 is safer, and the output voltage Vo can be more stable during load transient change.

Figure 3:
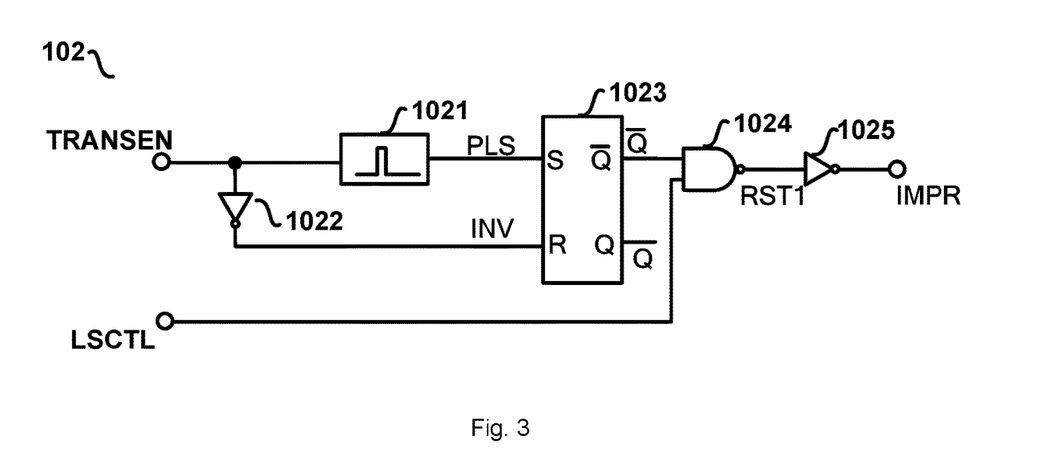
FIG. 3 illustrates a schematic diagram of a load transient enhancing module 102 in accordance with an embodiment of the present invention.

FIG. 3 illustrates a schematic diagram of the load transient enhancing module 102 in accordance with an embodiment of the present invention. The load transient enhancing module 102 may comprise a single pulse generator 1021, a first inverter 1022, an RS flip-flop 1023, a first NAND gate 1024 and a second inverter 1025. The single pulse generator 1021 may be configured to receive the load transient indication signal TRANSEN, and to output a single pulse signal PLS when the load transient indication signal TRANSEN indicates that transient change is occurring (i.e. has the active state). The first inverter 1022 may be configured to receive the load transient indication signal TRANSEN and to output an inverted signal INV of the load transient indication signal TRANSEN. The RS flip-flop 1023 may have a set input terminal S configured to receive the single pulse signal PLS, a reset input terminal R configured to receive the inverted signal INV of the load transient indication signal TRANSEN, a non-inverse output terminal Q configured to provide a non-inversion signal (also labeled as Q), and an inverse output terminal $\overline{Q}$ configured to provide an inversion signal (also labeled as $\overline{Q}$). The first NAND gate 1024 may be configured to receive the inversion signal $\overline{Q}$ and the secondary switch control signal LSCTL, and to perform NAND logic operation to the non-inversion signal $\overline{Q}$ and the secondary switch control signal LSCTL to provide a first operation result RST1 to the second inverter 1025. The second inverter 1025 is configured to perform inversion logic operation to the first operation result RST1 to provide the load transient enhancing signal IMPR. In this exemplary embodiment, when the load transient indication signal TRANSEN indicates that transient change is occurring (i.e. has the active state), the single pulse signal PLS sets the RS flip-flop 1023 to set the non-inversion signal Q to logic high state and the inversion signal $\overline{Q}$ to logic low state. For this situation, based on the logic low state of the inversion signal $\overline{Q}$, the first NAND gate 1024 locks the first operation result RST1 at logic high state no matter what logic state the secondary switch control signal LSCTL is at. That is to say, for this situation, it can be considered that the secondary switch control signal LSCTL is disabled/shielded by the logic low state of the inversion signal Q. Thus, the load transient enhancing signal IMPR is locked at the logic low state which controls the secondary switch MLS to switch off and lock at "OFF" state so that the body diode DLS of the secondary switch MLS is conducted. When the load transient indication signal TRANSEN indicates that no transient change is occurring (i.e. has the inactive state), the inverted signal INV of the load transient indication signal TRANSEN resets the RS flip-flop 1023 to reset the non-inversion signal Q to logic low state and the inversion signal $\overline{Q}$ to logic high state. For this situation, the first operation result RST1 is determined by the secondary switch control signal LSCTL and is logically complementary with the secondary switch control signal LSCTL. That is to say, for this situation, it can be considered that the secondary switch control signal LSCTL is enabled/unshielded by the logic high state of the inversion signal $\overline{Q}$. Thus, the load transient enhancing signal IMPR follows the secondary switch control signal LSCTL and has the same logic state as the secondary switch control signal LSCTL and thus controls the secondary switch MLS to perform normal on and off switching.

Figure 4:
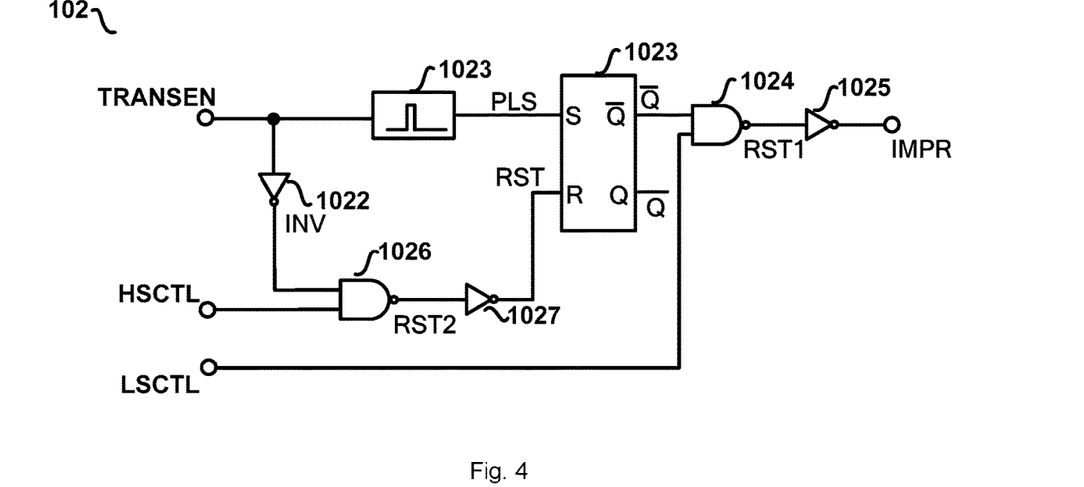
FIG. 4 illustrates a schematic diagram of a load transient enhancing module 102 in accordance with an alternative embodiment of the present invention.

FIG. 4 illustrates a schematic diagram of the load transient enhancing module 102 in accordance with an alternative embodiment of the present invention. Compared to the load transient enhancing module 102 of FIG. 3, except the single pulse generator 1021, the first inverter 1022, the RS flip-flop 1023, the first NAND gate 1024 and the second inverter 1025, the load transient enhancing module 102 of FIG. 4 may further comprise a second NAND gate 1026 and a third inverter 1027. The inverted signal INV of the load transient indication signal TRANSEN is input to a first input terminal of the second NAND gate 1026 instead of being input to the reset terminal of the RS flip-flop 1023. A second input terminal of the second NAND gate 1026 is configured to receive the main switch control signal HSCTL. The second NAND gate 1026 is configured to perform NAND logic operation to the inverted signal INV of the load transient indication signal TRANSEN and the main switch control signal HSCTL to provide a second operation result RST2. The third inverter 1027 is configured to perform inversion logic operation to the second operation result RST2 to provide a reset control signal RST to the reset terminal of the RS flip-flop 1023. In this exemplary embodiment, when the load transient indication signal TRANSEN indicates that transient change is occurring (i.e. has the active state), the single pulse signal PLS sets the RS flip-flop 1023 to set the non-inversion signal Q to logic high state and the inversion signal $\overline{Q}$ to logic low state. For this situation, based on the logic low state of the inversion signal $\overline{Q}$, the first NAND gate 1024 locks the first operation result RST1 at logic high state no matter what logic state the secondary switch control signal LSCTL is at. That is to say, for this situation, it can be considered that the secondary switch control signal LSCTL is disabled/shielded by the logic low state of the inversion signal Q. Thus, the load transient enhancing signal IMPR is locked at the logic low state which controls the secondary switch MLS to switch off and lock at "OFF" state so that the body diode DLS of the secondary switch MLS is conducted. When the load transient indication signal TRANSEN indicates that no transient change is occurring (i.e. has the inactive state), the inverted signal INV of the load transient indication signal TRANSEN has logic high state so that the second operation result RST2 is determined by the main switch control signal HSCTL and is logically complementary with the main switch control signal HSCTL. When the main switch control signal HSCTL changes to the logic state (e.g. logic high state) that drives the main switch MHS on, the second operation result RST2 changes to logic low state, and the reset control signal RST consequently changes to logic high state which resets the RS flip-flop 1023 to reset the non-inversion signal Q to logic low state and the inversion signal Q to logic high state. For this situation, the first operation result RST1 is determined by the secondary switch control signal LSCTL and is logically complementary with the secondary switch control signal LSCTL. That is to say, for this situation, it can be considered that the secondary switch control signal LSCTL is enabled/unshielded by the logic high state of the inversion signal $\overline{Q}$. Thus, the load transient enhancing signal IMPR follows the secondary switch control signal LSCTL and has the same logic state as the secondary switch control signal LSCTL and thus controls the secondary switch MLS to perform normal on and off switching.

One of ordinary skill in the art should understand that the load transient enhancing module 102 described above with reference to FIGS. 3 and 4 is illustrative and not limiting, various modifications may be made without departing from the spirit of the present invention. The load transient enhancing module 102 in accordance with various embodiments of the present invention may effectively improve the load transient response performance of the power converter 100, especially under low output voltage. For instance, load transient enhancing module 102 may help to reduce the overshoot in the output voltage Vo resulted from the load 105 transient change (e.g. the load 105 gets lighter instantly). The load transient enhancing module 102 has better load transient response performance improving effect when used in power converters having integrated power switches (e.g. the main switch MHS and the secondary switch MLS) with good substrate isolation (e.g. insensitive to substrate ions injection) or having discrete power switches.

Figure 5:
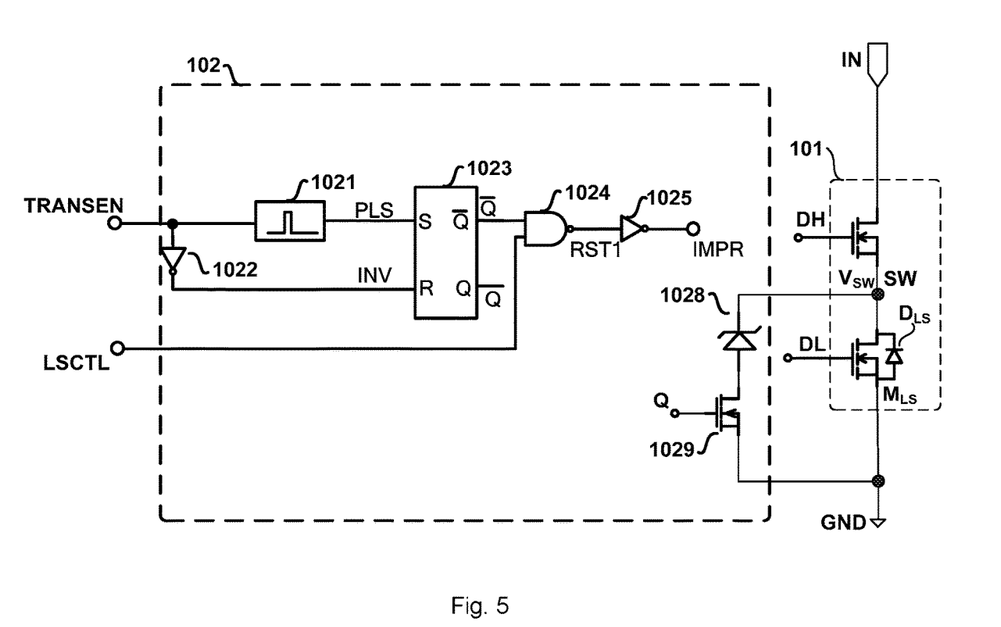
FIG. 5 illustrates a schematic diagram of a load transient enhancing module 102 in accordance with an alternative embodiment of the present invention.

In accordance with an embodiment of the present invention, as illustrated in FIG. 5, the secondary switch MLS of the power converter 100 may be sensitive to substrate ions injection. For such a secondary switch MLS, its body diode DLS may have limited allowable forward conduction time, which may not be able to satisfy the requirement of discharging the inductor current IL with a larger slope. In the example of FIG. 5, the load transient enhancing module 102 may further comprise a schottky diode 1028. The schottky diode 1028 may be connected in parallel with the secondary switch MLS between the switching node SW and the reference ground GND. Once the load 105 has transient change (e.g. once the load 105 gets lighter instantly), the load transient enhancing module 102 may be configured to turn off the secondary switch MLS and lock the secondary switch MLS at "OFF" state, and to turn on the schottky diode 1028 so that the inductor current IL flowing through the inductive power storage device Lo may be decreased with a larger slope. When no transient change is occurring in the load 105 or when load 105 transient change has been removed (or the overshoot in the output voltage Vo is removed), the load transient enhancing module 102 may further be configured to unlock the secondary switch MLS from the "OFF" state to allow the secondary switch MLS to perform normal on and off switching. In the exemplary embodiment of FIG. 5, the load transient enhancing module 102 may further comprise a schottky diode control switch 1029 which may be coupled in series with the schottky diode 1028 between the switching node SW and the reference ground GND. In the example of FIG. 5, the schottky diode 1028 has a cathode coupled to a drain of the secondary switch MLS, and an anode coupled to a first terminal of the schottky diode control switch 1029. A second terminal of the schottky diode control switch 1029 is coupled to a source of the secondary switch MLS. A control terminal of the schottky diode control switch 1029 may be configured to receive the non-inversion signal Q from the RS flip-flop 1023 of FIG. 3 or FIG. 4 (As an example, in FIG. 5, the control terminal of the schottky diode control switch 1029 is illustrated to receive the non-inversion signal Q from the RS flip-flop 1023 of FIG. 3). The working principles of the load transient enhancing module 102 of FIG. 5 are similar as those of the load transient enhancing module 102 of FIGS. 3 and 4. One difference lies in that for the load transient enhancing module 102 of FIG. 5, the non-inversion signal Q turns the schottky diode control switch 1029 on to turn on the schottky diode 1028 when the load transient indication signal TRANSEN indicates that transient change is occurring (i.e. has the active state), and turns the schottky diode control switch 1029 off to turn off the schottky diode 1028 when the load transient indication signal TRANSEN indicates that no transient change is occurring (i.e. has the inactive state).

Figure 6:
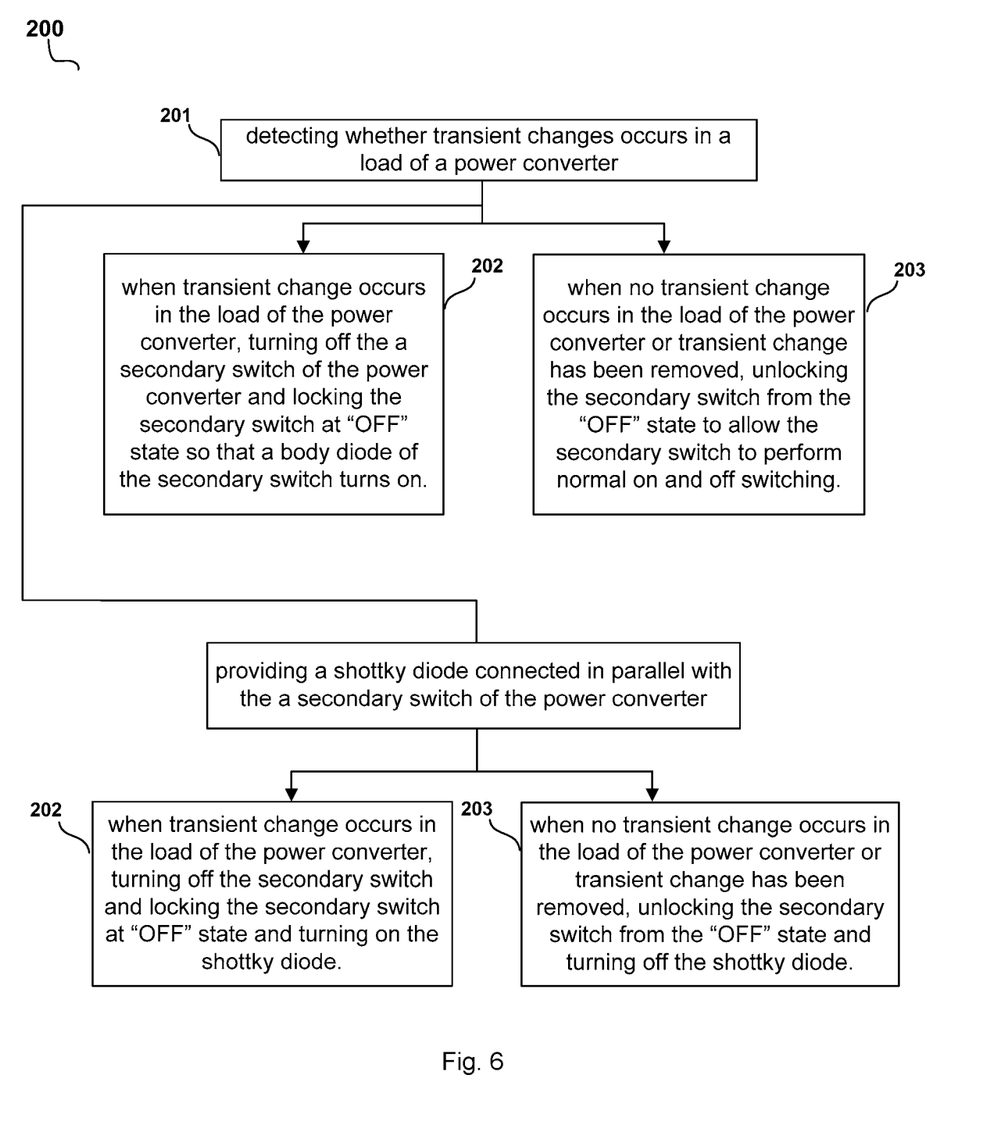
FIG. 6 illustrates a flow chart illustrating a method 200 for improving load transient response of a power converter in accordance with an embodiment of the present invention.

FIG. 6 illustrates a flow chart illustrating a method 200 for improving load transient response of a power converter. The power converter (e.g. the power converter 100 described with reference to FIGS. 1-5) may comprise a main switch (e.g. the main switch MHS in FIGS. 1-5) and a secondary switch (e.g. the secondary switch MLS in FIGS. 1-5). The method 200 may comprise: step 201, detecting whether transient changes is occurring in a load of the power converter; step 202, when transient change is occurring in the load of the power converter (e.g. once the load gets lighter instantly or overshoot is occurring in an output voltage of the power converter), turning off the secondary switch and locking the secondary switch at "OFF" state so that a body diode of the secondary switch turns on; and step 203, when no transient change is occurring in the load of the power converter (or transient change or overshoot in the output voltage has been removed), unlocking the secondary switch from the "OFF" state to allow the secondary switch to perform normal on and off switching.

In accordance with an embodiment of the present invention, if the secondary switch of the power converter is sensitive to substrate ions injection, the method 200 may further comprise: providing a schottky diode connected in parallel with the secondary switch; at step 202, when transient change is occurring in the load of the power converter, turning off the secondary switch and locking the secondary switch at "OFF" state and turning on the schottky diode; and at step 203, when no transient change is occurring in the load of the power converter, unlocking the secondary switch from the "OFF" state and turning off the schottky diode.

The advantages of the various embodiments of the present invention are not confined to those described above. These and other advantages of the various embodiments of the present invention will become more apparent upon reading the whole detailed descriptions and studying the various figures of the drawings.

From the foregoing, it will be appreciated that specific embodiments of the present invention have been described herein for purposes of illustration, but that various modifications may be made without deviating from the technology. Many of the elements of one embodiment may be combined with other embodiments in addition to or in lieu of the elements of the other embodiments. Accordingly, the present invention is not limited except as by the appended claims.

What is claimed is:

1. A load transient enhancing module for a power converter having a main switch and a secondary switch, comprising: a first input terminal, configured to receive a secondary switch control signal, wherein the secondary switch control signal is used to control on and off switching of the secondary switch; a second input terminal, configured to receive a load transient indication signal, wherein the load transient indication signal indicates whether a transient change is occurring in a load of the power converter; and an output terminal, configured to provide a load transient enhancing signal; wherein the load transient enhancing module is configured to generate the load transient enhancing signal at least based on the secondary switch control signal and the load transient indication signal; and wherein when the load transient indication signal indicates that a transient change is occurring, the load transient enhancing module is configured to disable the secondary switch control signal and to set the load transient enhancing signal to turn off the secondary switch and lock the secondary switch at "OFF" state so that a body diode of the secondary switch is turned on; and wherein the load transient enhancing module further comprises a third input terminal, configured to receive a main switch control signal, and wherein the main switch control signal is logically complementary with the secondary switch control signal and is used to control on and off switching of the main switch; and wherein when the load transient indication signal indicates that no transient change is occurring as well as the main switch control signal changes to a logic state that drives the main switch on, the load transient enhancing module is configured to enable the secondary switch control signal, and to synchronize the load transient enhancing signal with the secondary switch control signal.

2. The load transient enhancing module of claim 1, further comprising:
a single pulse generator, configured to receive the load transient indication signal, and to output a single pulse signal when the load transient indication signal indicates that transient change is occurring;
a first inverter, configured to receive the load transient indication signal and to output an inverted signal of the load transient indication signal;
an RS flip-flop, having a set input terminal configured to receive the single pulse signal, a reset input terminal configured to receive the inverted signal of the load transient indication signal, a non-inverse output terminal configured to provide a non-inversion signal, and an inverse output terminal configured to provide an inversion signal;
a first NAND gate, configured to receive the inversion signal and the secondary switch control signal, and to perform NAND logic operation to the non-inversion signal and the secondary switch control signal to provide a first operation result; and
a second inverter, configured to perform inversion logic operation to the first operation result to provide the load transient enhancing signal.

3. The load transient enhancing module of claim 2, wherein: when the load transient indication signal indicates that transient change is occurring, the single pulse signal sets the RS flip-flop to set the non-inversion signal to logic high state and the inversion signal to logic low state, which disables the secondary switch control signal and locks the load transient enhancing signal at logic low state, wherein the secondary switch is switched off and locked at "OFF" state by the load transient enhancing signal so that the body diode of the secondary switch is conducted; and wherein when the load transient indication signal indicates that no transient change is occurring, the inverted signal of the load transient indication signal resets the RS flip-flop to reset the non-inversion signal to logic low state and the inversion signal to logic high state, which enables the secondary switch control signal, wherein the load transient enhancing signal follows the secondary switch control signal and has the same logic state as the secondary switch control signal to control the secondary switch to perform normal on and off switching.

4. The load transient enhancing module of claim 2, further comprising:
a schottky diode, connected in parallel with the secondary switch; and
a schottky diode control switch, coupled in series with the schottky diode, wherein a control terminal of the schottky diode control switch is configured to receive the non-inversion signal; and wherein when the load transient indication signal indicates that transient change is occurring, the non-inversion signal turns the schottky diode control switch on to turn on the schottky diode; and wherein when the load transient indication signal indicates that no transient change is occurring, the non-inversion signal turns the schottky diode control switch off to turn off the schottky diode.

5. The load transient enhancing module of claim 1, further comprising:
a single pulse generator, configured to receive the load transient indication signal, and to output a single pulse signal when the load transient indication signal indicates that transient change is occurring;
a first inverter, configured to receive the load transient indication signal and to output an inverted signal of the load transient indication signal;
an RS flip-flop, having a set input terminal configured to receive the single pulse signal, a reset input terminal, a non-inverse output terminal configured to provide a non-inversion signal, and an inverse output terminal configured to provide an inversion signal;
a first NAND gate, configured to receive the inversion signal and the secondary switch control signal, and to perform NAND logic operation to the non-inversion signal and the secondary switch control signal to provide a first operation result;
a second inverter, configured to perform inversion logic operation to the first operation result to provide the load transient enhancing signal;
a second NAND gate, configured to receive the inverted signal of the load transient indication signal and a main switch control signal which is used to control on and off switching of the main switch, and to perform NAND logic operation to the inverted signal of the load transient indication signal and the main switch control signal to provide a second operation result; and
a third inverter, configured to perform inversion logic operation to the second operation result to provide a reset control signal to the reset terminal of the RS flip-flop.

6. The load transient enhancing module of claim 5, wherein: when the load transient indication signal indicates that transient change is occurring, the single pulse signal sets the RS flip-flop to set the non-inversion signal to logic high state and the inversion signal to logic low state, which disables the secondary switch control signal and locks the load transient enhancing signal at logic low state, wherein the secondary switch is switched off and locked at "OFF" state by the load transient enhancing signal so that the body diode of the secondary switch is conducted; and wherein; when the load transient indication signal indicates that no transient change is occurring as well as the main switch control signal changes to the logic state that drives the main switch on, the reset control signal changes to logic high state which resets the RS flip-flop to reset the non-inversion signal to logic low state and the inversion signal to logic high state, which enables the secondary switch control signal, wherein the load transient enhancing signal follows the secondary switch control signal and has the same logic state as the secondary switch control signal to control the secondary switch to perform normal on and off switching.

7. The load transient enhancing module of claim 5, further comprising:
- a schottky diode, connected in parallel with the secondary switch; and
- a schottky diode control switch, coupled in series with the schottky diode, wherein a control terminal of the schottky diode control switch is configured to receive the non-inversion signal; and wherein when the load transient indication signal indicates that transient change is occurring, the non-inversion signal turns the schottky diode control switch on to turn on the schottky diode; and wherein when the load transient indication signal indicates that no transient change is occurring, the non-inversion signal turns the schottky diode control switch off to turn off the schottky diode.

8. The load transient enhancing module of claim 1, further comprising:
- a schottky diode connected in parallel with the secondary switch, wherein when the load transient indication signal indicates that transient change is occurring, the load transient enhancing module is configured to turn off the secondary switch and lock the secondary switch at "OFF" state, and to turn on the schottky diode instead of the body diode.

9. The load transient enhancing module of claim 8, wherein when the load transient indication signal indicates that no transient change is occurring, the load transient enhancing module is further configured to turn off the schottky diode, and to synchronize the load transient enhancing signal with the secondary switch control signal so as to control the secondary switch to perform normal on and off switching.

* * * * *